United States Patent [19]
Hoshino

[11] Patent Number: 5,178,722
[45] Date of Patent: Jan. 12, 1993

[54] METHOD OF PRODUCING A FLEXIBLE METAL AND RESIN FILM LAMINATE WITH HOLES

[75] Inventor: Takahiro Hoshino, Yokohama, Japan

[73] Assignee: Toyo Bossan Kabushiki Kaisha, Tokyo, Japan

[21] Appl. No.: 726,222

[22] Filed: Jul. 5, 1991

Related U.S. Application Data

[62] Division of Ser. No. 516,729, Apr. 30, 1990, abandoned.

[51] Int. Cl.⁵ .......................... B44C 1/22; C23F 1/00
[52] U.S. Cl. .................................. 156/630; 156/644; 156/659.1; 156/656; 156/665; 156/904
[58] Field of Search .............. 156/630, 644, 659.1, 156/656, 664, 665, 666, 904, 634

[56] References Cited

U.S. PATENT DOCUMENTS

| | | | |
|---|---|---|---|
| 4,242,378 | 12/1980 | Arai | 156/668 X |
| 4,288,282 | 9/1981 | Brown et al. | 156/630 |
| 4,869,778 | 9/1989 | Cote | 156/660 X |
| 4,915,780 | 4/1990 | Beckett | 156/665 X |

Primary Examiner—William A. Powell
Attorney, Agent, or Firm—Rogers & Killeen

[57] ABSTRACT

A multifunctional sheet of the present invention comprises a base sheet comprising a transparent synthetic resin film and a conductive metal layer which is laminated on the overall upper surface of the base sheet and which has many fine through holes formed substantially uniformly or in an appropriate pattern so as to have see-through so that the metal layer functions as a layer for shielding electromagnetic wave noise or a communication antenna material. The sheet can be used as an electromagnetic shielding material, a heater material, an antenna material, a light shielding sheet and so on.

9 Claims, 2 Drawing Sheets

METHOD OF PRODUCING A FLEXIBLE METAL AND RESIN FILM LAMINATE WITH HOLES

This is a division of application Ser. No. 516,729-, filed Apr. 30, 1990, now abandoned.

BACKGROUND OF THE INVENTION

The present invention relates to a sheet having see-through and flexibility and functions which allow it to be used as electromagnetic wave shielding materials, antenna materials and heater materials.

Synthetic resin films and sheets, which are generally known as sheet materials having see-through, flexibility and shielding properties to electromagnetic wave noise, contain metal fillers consisting of aluminum, copper, zinc, stainless steel or the like which are respectively mixed in the raw materials used for forming the films and sheets for the purpose of imparting conductivity to them during molding.

However, each of such conventional synthetic resin films and sheets having shielding properties to electromagnetic wave noise is formed as a material for exclusively shielding electromagnetic waves by using a raw material in which a conductive metal filler is mixed during the molding process. There is thus the problem that it is necessary to appropriately select the form of the metal filler mixed in the raw material from the group consisting of flakes, powder, fibers and the like in view of the purpose of use of the film or sheet formed, the moldability and the production cost before the molding process.

There are also the problems that the mixing of a metal filler in the resin during molding of a film or sheet causes the deterioration in moldability of the synthetic resin used and the appearance of the product, and that, if large quantities of metal filler are mixed in a raw material, although electromagnetic shielding properties are improved, see-through are deteriorated.

SUMMARY OF THE INVENTION

It is an object of the present invention to solve the problems of conventional films and sheets which are formed as materials for exclusively shielding electromagnetic waves and provide a sheet which has electromagnetic wave shielding properties and see through, as well as multiple functions which allow it to be used as an antenna material and a heater material.

To this end, such a multifunctional sheet of the present invention comprises a base sheet made of a transparent synthetic resin film, and a conductive metal layer with see-through which is laminated over the entire upper surface of the base sheet and which has many fine through holes formed substantially uniformly or in an appropriate pattern so that the metal layer functions as a layer for shielding electromagnetic wave noise, a communication antenna material or a heater material. The method of producing the sheet comprises the steps of laminating a photoresist resin layer on the conductive metal layer formed on the upper surface of the base sheet made of a transparent synthetic resin film, curing the photoresist resin so as to form many fine holes in the resin layer substantially uniformly or in an appropriate pattern, removing the uncured photoresist resin and forming by etching many fine through holes uniformly or an appropriate pattern in the conductive metal layer, and, as occasion demands, removing the photoresist resin remaining on the metal layer.

Electromagnetic waves are absorbed and cut off by the metal portion of the conductive metal layer which is formed on the upper surface of the base sheet and which has many fine holes formed uniformly or in an appropriate pattern so as to exhibit see-through.

When the rate of see-through of the laminate comprising the base sheet and the conductive metal layer having fine through holes is 70% or more, the sheet of the present invention can be used as a light-shielding sheet having see-through.

The sheet of the present invention can be bonded to glass plate in such a manner that the side of the conductive metal layer contacts with the inner side of the glass plate or inserted into laminated glass plates, for example, so as to impart conductivity to the rows of the fine through holes in a longitudinal, lateral or diagonal antenna pattern formed in the conductive metal layer. This permits the sheet to be used as an antenna material. The sheet of the invention can also be used as a surface heater when a terminal of a power source is connected to a metal portion of the metal layer.

BRIEF DESCRIPTION OF THE DRAWINGS

FIG. 4 is a drawing which shows the process of producing a multifunctional sheet of the present invention, in which FIG. 4(a) is a sectional view of a sheet comprising a base sheet and a metal layer, FIG. 4(b) is an enlarged sectional view of the same in which a photoresist resin having many fine through holes uniformly formed therein is laminated on the base sheet, FIG. 4(c) is an enlarged sectional view of the same in which many fine through holes are formed in the metal layer by etching, and FIG. 4(d) is an enlarged sectional view of the same in which the photoresist resin layer is removed.

DETAILED DESCRIPTION OF PREFERRED EMBODIMENTS

An embodiment of the present invention is described in detail below with reference to the drawings.

Figure 1:
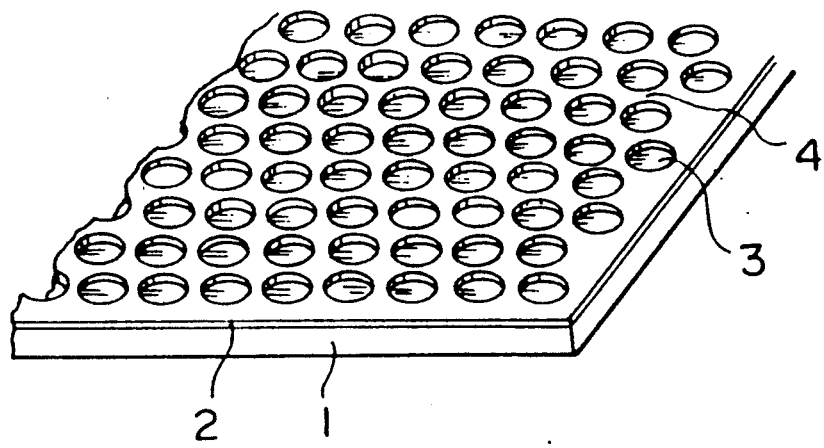
FIG. 1 is a partially enlarged perspective view of an embodiment of a multifunctional sheet of the present invention.
Figure 2:
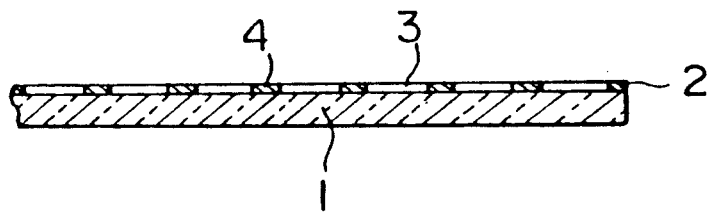
FIG. 2 is an enlarged sectional view of the same.
Figure 3:
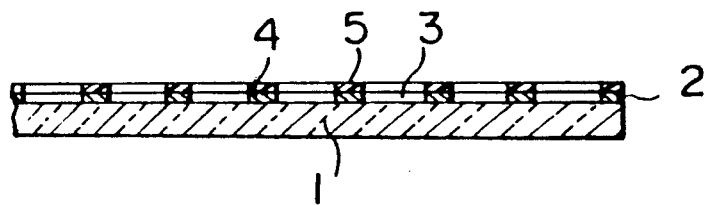
FIG. 3 is an enlarged sectional view of another embodiment.
Figure 4:
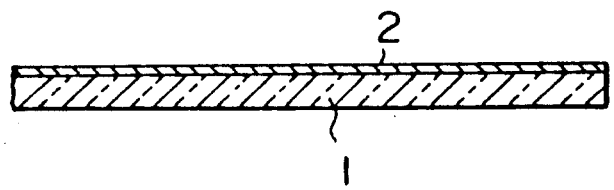
Figure 4:
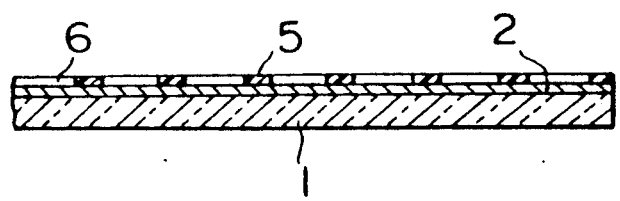
Figure 4:
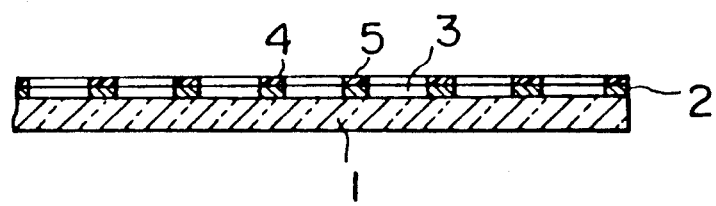
Figure 4:
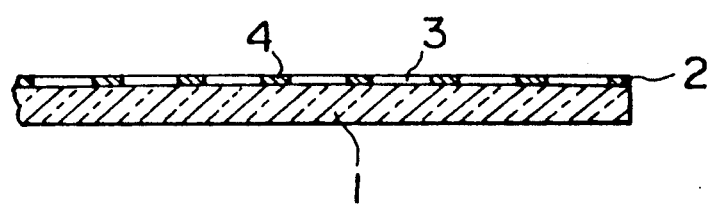

FIG. 1 is a partially enlarged perspective view of an embodiment of the multifunctional sheet of the present invention, FIG. 2 is an enlarged sectional view of the same, FIG. 3 is an enlarged sectional view of another embodiment, and FIG. 4 is a drawing which shows the process of producing a multifunctional sheet of the present invention. In FIG. 4, FIG. 4(a) is a sectional view of a sheet comprising a base sheet and a metal layer, FIG. 4(b) is an enlarged sectional view of the same in which a photoresist resin having many fine through holes uniformly formed therein is laminated on the base sheet, FIG. 4(c) is an enlarged sectional view of the same in which many fine through holes are formed in the metal layer by etching, which corresponds to FIG. 3 and FIG. 4(d) is an enlarged sectional view of the same in which the photoresist resin layer is removed, which corresponds to FIG. 2.

In FIGS. 1 and 2, reference numeral 1 denotes a transparent synthetic resin film which is used as the base sheet of the present invention and which has a thickness of about 10 to 50μ; reference numeral 2, a conductive metal layer having many fine through holes 3 which are uniformly formed so as to have see-through when it is laminated; and reference numeral 4, the metal portion of the metal layer 2. An embodiment of the multifunctional sheet of the present invention comprises these layers.

FIG. 3 shows another embodiment of the multifunctional sheet of the present invention in which a photoresist resin layer 5 having an appropriate color is formed on the metal portion 4 of the multifunctional sheet of the above embodiment.

In each of the embodiments, the metal portion 4 is formed in fine lines having a width within the range of about 70 to 500μ. The total area of the fine through holes 3 surrounded by the lines is, for example, at least 70% of the surface area of the sheet. The area ratio between the fine through holes 3 and the portions other than the holes is 0.5:1 to 5:1 in some cases.

The above multifunctional sheet of the present invention configured as described above can be produced by the following method:

The colored photoresist resin film 5 in which many fine through holes 6, which are the same as the fine through holes 2, are uniformly formed, is laminated in a foil or film on the surface of the metal layer 2 of the sheet comprising the transparent synthetic resin film 1 and the conductive metal layer 2 which consists of aluminum, copper, stainless steel, iron or the like and which is laminated over the entire upper surface of the film 1 (refer to FIG. 4(a)), and the photoresist resin is then cured by irradiation of ultraviolet rays (refer to FIG. 4(b)).

The conductive metal layer is then etched through the fine through holes 6 of the photoresist resin film 5 to form the fine through holes 3 (refer to FIG. 4(c)). The thus-formed multifunctional sheet is the same as that shown in FIG. 3. Although the sheet can be used without any change according to purposes, the photoresist resin layer is generally further removed to form a multifunctional sheet which is the same as that shown in FIGS. 1 and 2 (refer to FIG. 4(d)).

In the above method, the photoresist resin film 5, in which the fine through holes 6 are previously formed, is bonded to the surface of the conductive metal layer 2 for the purpose of forming the photoresist resin layer. However, the method of forming the fine through holes 3 is not limited to this method, and the fine through holes 3 may be formed in the conductive metal layer 2 by applying a photoresist resin solution to the surface of the conductive metal layer 2 to form a laminated resin layer, curing by irradiation of ultraviolet rays so as to uniformly form many fine holes in the resin layer, and then removing uncured resin, as well as etching the conductive metal layer 2 so as to form the fine through holes 3 therein.

The multifunctional sheet of the present invention configured as described above and produced by the above-mentioned method has the many fine through holes which are formed uniformly or in a pattern in the conductive metal layer laminated on the surface of the base sheet so that the metal layer has see-through after being laminated on the base sheet. If the multifunctional sheet is used as an electromagnetic wave shielding material, therefore, the metal portion of the conductive metal layer absorbs and cuts off electromagnetic waves. In addition, if the rate of see-through is at least 70%, the multifunctional sheet can be used as a light-shielding sheet having see-through.

If the sheet is bonded to the window glass of a building or the front glass of a car in such a manner that the side of the conductive metal layer contacts therewith, therefore, it is possible to cut off electromagnetic waves which enter the building or the car, see the outside without any adverse effect of electromagnetic waves and make it difficult to see the inside of a building or car from the outside.

Further, if part of the metal portion in the metal layer is provided with conductivity, for example, in the form of a longitudinal, lateral or diagonal antenna pattern, the sheet of the present invention can be used as an antenna material having the functions as an electromagnetic shielding material or a light-shielding material.

In addition, the sheet can be used as a surface heater when it is bonded to a glass plate used in a building or car in such a manner that the conductive metal layer contacts with the inner side of the glass plate or it is interposed between laminated glass plates, and the terminal of a power source is connected to the metal portion of the metal layer. If the sheet is bonded to the front glass of a car in the above-described manner, therefore, it is possible to prevent frosting on the glass.

As described above, the present invention can be conveniently used in various applications such as an electromagnetic wave shielding material, a surface heater, an antenna, a light shielding sheet and the like. The sheet of the present invention can be easily produced with high precision by employing part of a technique of producing printed wiring board or the like.

What is claimed is:

1. A method of producing a multifunctional sheet comprising the steps of:
   a. laminating a photoresist resin layer on a conductive metal layer formed on a base sheet made of a transparent synthetic resin film;
   b. curing said resin so that many fine through holes are formed in said resin layer in a generally uniformly spaced pattern, said fine holes having a total area between about 30% and 85% of the area of the photoresist resin layer; and;
   c. removing uncured photoresist resin as well as forming many fine through holes by etching an appropriate pattern in said conductive metal layer; and
   d. removing the photoresist resin remaining on said metal layer.

2. The method of producing a multifunctional sheet according to claim 1, wherein said photoresist resin layer is colored.

3. The method of producing a multifunctional sheet according to claim 1 wherein said fine through holes each have a diameter substantially greater than its depth.

4. The method of producing a multifunctional sheet according to claim 3 wherein said fine through holes are formed so that the rate of see through is at least 70%

5. A method of producing a flexible and semitransparent multifunctional laminate that can be used as an electromagnetic wave shield comprising the steps of:
   a. providing a flexible, transparent base sheet comprising a synthetic resin having a thickness between approximately ten and fifty microns;
   b. laminating a flexible, electrifiable metallic layer on said base sheet, said metallic layer having a thickness less than the thickness of said base sheet;
   c. laminating a photoresistive resin layer on said metallic layer, said resin layer having a multiplicity of generally uniformly spaced fine holes therethrough, said fine holes having a total area between about 30% and 85% of the area of the photoresistive resin layer; and d. etching said metallic layer through said multiplicity of fine holes in said resin layer so as to form a multiplicity of fine holes in said metallic layer corresponding to the holes in the photoresistive resin layer.

6. The method of producing the laminate as defined in claim 5 further comprising the step of (e) removing said resin layer.

7. A method of producing a transparent electromagnetic wave shield laminate for a window comprising the steps of:

a. providing a flexible, transparent base sheet of synthetic resin having a size approximating that of a window to covered with the laminate and having a thickness between approximately ten and fifty microns;

b. laminating a flexible, electrirfiable metallic layer on said base sheet, said metallic layer having a thickness less than the thickness of said base sheet;

c. laminating a photoresistive resin layer on said metallic layer, said resin layer having a multiplicity of generally uniformly spaced fine holes therethrough, the distance between the perimeters of adjacent said holes being about 70 to 500 microns, the total area of the holes being at least 70% of the area of the window to be covered so that the laminate will be transparent and no more than about 85% of the area of the window so that the laminate will provide a shield to electromagnetic waves;

d. curing said photoresistive resin layer; and e. etching said metallic layer through said multiplicity of fine holes in said resin layer so as to form a multiplicity of fine holes in said metallic layer corresponding to the holes in the photoresistive resin layer.

8. The method as defined in claim 7 further comprising the steps of providing a color to said photoresistive resin layer and not removing the colorized photoresistive resin layer so that the laminate will be colored.

9. The method as defined in claim 5 wherein said fine holes have a total area greater than about 70% of the area of the photoresistive resin layer so that the laminate is transparent.

* * * * *